(12) United States Patent
Rhee et al.

(10) Patent No.: US 6,171,958 B1
(45) Date of Patent: Jan. 9, 2001

(54) PROCESS FOR PREPARATION OF DIFFUSION BARRIER FOR SEMICONDUCTOR

(75) Inventors: Shi Woo Rhee; Ju Young Yun, both of Pohang (KR)

(73) Assignee: Postech Foundation (KR)

( * ) Notice: Under 35 U.S.C. 154(b), the term of this patent shall be extended for 0 days.

(21) Appl. No.: 09/006,948

(22) Filed: Jan. 14, 1998

(30) Foreign Application Priority Data

Jan. 15, 1997 (KR) ........................................... 97-973

(51) Int. Cl.⁷ ..................................... H01L 21/44

(52) U.S. Cl. .................. 438/681; 438/680; 438/660; 438/683; 438/685; 427/250; 427/252

(58) Field of Search ................................. 438/660, 681, 438/683, 685; 427/534, 250, 252, 255.2

(56) References Cited

U.S. PATENT DOCUMENTS

| 5,254,499 | * | 10/1993 | Sandhu et al. | 438/685 |
| 5,278,100 | * | 1/1994 | Doan et al. | 438/660 |
| 5,714,546 | * | 4/1998 | Sundhu . | |
| 5,741,546 | * | 4/1998 | Sandhu | 427/255.1 |
| 5,856,704 | * | 1/1999 | Schuele | 257/754 |
| 5,989,652 | * | 11/1999 | Ameen et al. | 427/534 |

* cited by examiner

*Primary Examiner*—David Nelms
*Assistant Examiner*—Reneé R. Berry
(74) *Attorney, Agent, or Firm*—Anderson Kill & Olick, PC

(57) ABSTRACT

A process for preparing a diffusion barrier on a semiconductor substrate which comprises: conducting remote plasma-enhanced metal organic chemical vapor deposition of a thin film of $TiN_x$ on said substrate using an organotitanium compound under a flow of $H_2$ plasma, wherein x ranges from 0.1 to 1.5, provides a $TiN_x$ thin film having a low carbon content and low specific resistivity.

4 Claims, 3 Drawing Sheets

PROCESS FOR PREPARATION OF DIFFUSION BARRIER FOR SEMICONDUCTOR

FIELD OF THE INVENTION

The present invention relates to a process for preparing a diffusion barrier for a semiconductor device; and more particularly, to a process for preparing a diffusion barrier having a low specific resistivity on a semiconductor substrate by way of conducting remote plasma-enhanced metal organic chemical vapor deposition of a thin film of $TiN_x$ under a flow of $H_2$ plasma as a reaction gas.

BACKGROUND OF THE INVENTION

Recently, $TiN_x$ has drawn attention as an important material for ultra large scale integrated circuits (ULSIC) having a line width of 0.5pm or less; a $TiN_x$ thin film is used as a diffusion barrier to protect shallow silicon junctions in the formation of Al contacts on a silicon wafer (J-Y Yun and S-W Rhee, *Korean J. Chem. Eng.*, 13(5), 510(1996)).

Such diffusion barrier is required to have a low specific resistivity among others, and the specific resistivity of a $TiN_x$ film is influenced by the presence of impurities such as carbon and oxygen, structural defects such as vacancies, and also by the size of the grains that constitute the film. The grain size varies with the process conditions such as the deposition temperature, and in general, as the grain size becomes larger, the specific resistivity of the film becomes lower. It is particularly important to minimize impurity content of a $TiN_x$ film if it is intended for use as a diffusion barrier.

Chemical vapor deposition(CVD) has been widely used in the preparation of $TiN_x$ films, wherein inorganic compounds such as titanium tetrachloride ($TiCl_4$) or organotitanium compounds such as tetrakis-dimethylamidotitanium (TDMAT) and tetrakis-diethylamidotitanium(TDEAT) are generally employed as precursors (I. J. Raaijmakers, *Thin Solid Films*, 247, 85(1994); S. R. Kurtz and R. G. Gordon, *Thin Solid Films*, 140, 277(1986))).

CVD of $TiN_x$ using $TiC_4$ is disadvantageous in that the deposition temperature ranging from 500 to 600 C is generally too high for the ULSIC application, and also that chlorine may be incorporated in the final $TiN_x$ film, causing a corrosion problem (I. J. Raaijmakers, loco citato).

Further, CVD of $TiN_x$ using organotitanium compounds often entails problems such as carbon contamination, a low step coverage and high specific resistivity. For example, when a $TiN_x$ film is deposited by a CVD process using an organotitanium compound in the presence of gaseous ammonia as a reaction gas, ammonia reacts with the precursor in the gas phase to form particles. The particles thus formed get incorporated into the $TiN_x$ film and the smoothness of the film surface becomes deteriorated, leading to an increase in the specific resistivity (J. A. Prybyla et al., *J. Electrochem. Soc.*, 140, 2695(1993)).

To avoid such problems, a thermal decomposition process which uses an organometallic compounds in the absence of ammonia has been suggested. However, this process gives a high level of contaminants and the resulting film has a high specific resistivity (I. J. Raaijmakers, loco citato).

SUMMARY OF THE INVENTION

It is, therefore, a primary object of the present invention to provide a process for the preparation of a $TiN_x$ diffusion barrier for a semiconductor device, said $TiN_x$ barrier having a low carbon content and low resistivity.

In accordance with the present invention, there is provided a process for preparing a diffusion barrier on a semiconductor substrate which comprises: conducting remote plasma-enhanced metal organic chemical vapor deposition of a thin film of $TiN_x$ on said substrate using an organotitanium compound under a flow of $H_2$ plasma, wherein x ranges from 0.1 to 1.5.

BRIEF DESCRIPTION OF THE DRAWINGS

The above and other objects and features of the present invention will become apparent from the following description of the invention, when taken in conjunction with the accompanying drawings, in which.

DETAILED DESCRIPTION OF THE INVENTION

As used herein, the term "a $TiN_x$ thin film" means a thin film containing titanium and nitrogen in a ratio ranging from 0.1 to 1.5.

The representative substrates, which may be used in the present invention, include semiconductor devices such as D-RAM, S-RAM, F-RAM, Logic, AISIC, microprocessor and TFT.

The representative organotitanium precursors, which may be used in the present invention, include alkylamidotitanium derivatives such as TDMAT and TDEAT.

Generally, such alkylamidotitanium compound undergoes thermal decomposition to form a ring compound containing a three-membered Ti-N-C ring by p-hydrogen elimination as in Eq. (1).

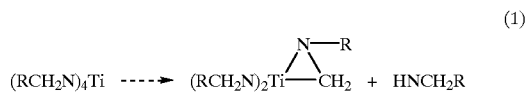

(1)

In a thermal chemical vapor deposition process using the above organic precursor in the absence of a reaction gas, the ring compound may be incorporated into the $TiN_x$ film produced, and thus, the final film tends to contain a large amount of carbon, i.e., 20 to 30%.

In case when $N_2$ plasma is used in a CVD process, a similar thermal decomposition reaction of the precursor apparently takes place, as judged from the observation that a major amount of carbonaceous carbon is incorporated into the $TiN_x$ film formed.

In contrast, when $H_2$ plasma is employed in a CVD process, hydrogen radical species generated in the $H_2$ plasma react with the precursor to form a Ti-rich $TiN_x$ and a stable alkylamine as a byproduct which escapes from the reactor without leading to a carbonaceous material.

Accordingly, only a small amount of carbon is incorporated into the TiN$_x$ film and the specific resistivity of the final film is lower than that prepared by using N$_2$ plasma CVD.

Thus, the H$_2$ plasma-enhanced CVD process of the present invention provides a TiN$_x$ film having a low specific resistivity due to its low carbon content of less than 30 atom % based on the sum of titanium, nitrogen and carbon atom constituents of the film.

Figure 1:
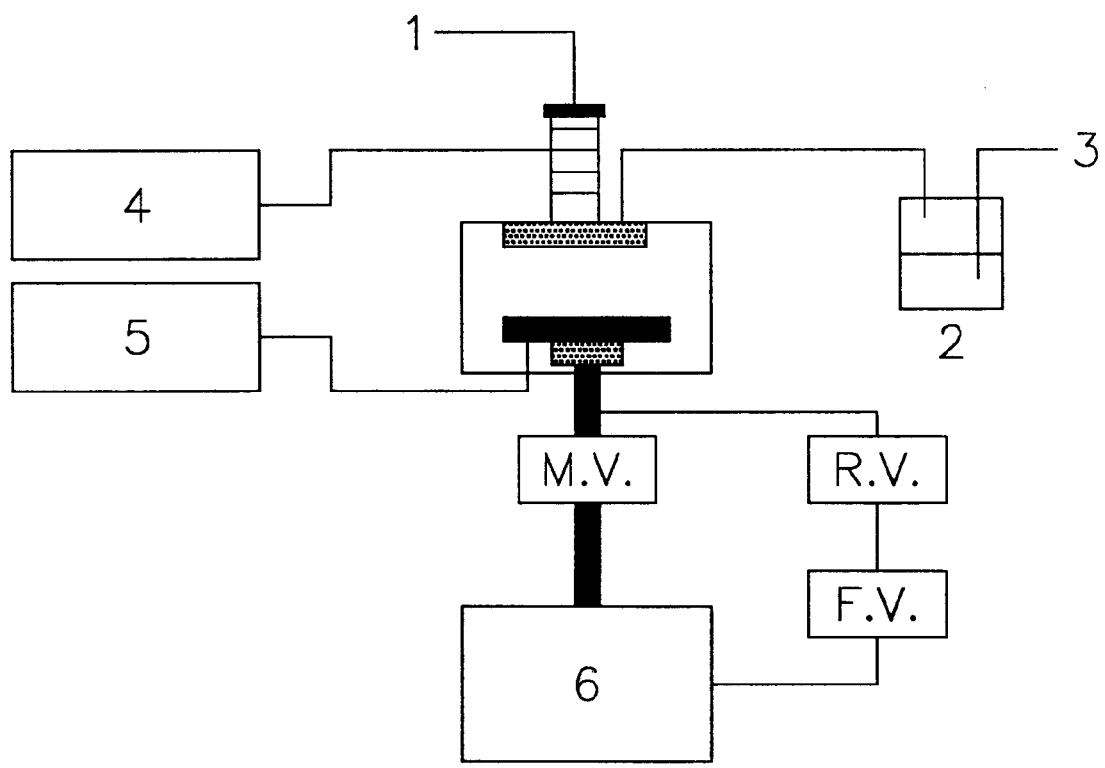
FIG. 1 shows a schematic diagram of an apparatus for the remote plasma-enhanced metal organic chemical vapor deposition used in practicing one embodiment of the present invention.

The thin film of TiN$_x$ of the present invention may be formed as a diffusion barrier for a semiconductor device in accordance with the process described below:

FIG. 1 shows a schematic diagram of an apparatus for the remote plasma-enhanced metal organic chemical vapor deposition process of the present invention, which comprises a feeding system for an organotitanium compound, a chemical vapor deposition reactor, and a vacuum system which controls the pressure within the reactor. A reaction gas(1) is delivered to an upstream region of the reactor, i.e., plasma generating region, and then, is excited by plasma generator(4) (electric power: 1–80W; temperature: 250–500° C.; flow rate of plasma reaction gas: 20–150 sccm); while the organometallic compound(2) and carrier gas(3) are delivered from the bubbler to a downstream region of the reactor.

The excited reaction gas (1) reacts with the organometallic compound (2) to produce a TiN$_x$ thin film on the substrate (7) wherein the temperature of the substrate is adjusted by temperature controller (5) and the total pressure in the reactor was controlled at a preset pressure, e.g., 1 Torr, using diffusion pump (6).

The following Example are intended to illustrate the present invention more specifically, without limiting the scope of the invention.

In Example and Comparative Example, characterization of film samples was conducted by employing X-ray photoelectron spectroscopy(XPS) and specific resistivity measurement with a four point probe.

EXAMPLE

Remote plasma MOCVD of a TiN$_x$ film was carried out in a cold wall type plasma chemical vapor deposition apparatus (Korea Vacuum Co.), wherein only the substrate is heated so as to prevent TiN$_x$ deposition onto the wall, and the deposition was conducted using a P-type Si-(100) wafer as a substrate, TDEAT, H$_2$ as a plasma gas and nitrogen as a carrier gas of TDEAT.

The electric power and temperature of the plasma were 40 W and 350° C., respectively, and the H$_2$ flow rate was in the range of 30 and 90 sccm, while maintaining the total pressure at 1 Torr.

The chemical constitution of the prepared TiN$_x$ film was analyzed by XPS and the results are shown in Table I.

COMPARATIVE EXAMPLE

The procedure of Example was repeated except that N$_2$ plasma was used in place of H$_2$ plasma.

The chemical constitution of the TiN$_x$ film thus prepared was analyzed by XPS and the results are shown in Table I.

TABLE I

|  | Ti(atm, %) | | N(atm, %) | | C(atm, %) | |
| --- | --- | --- | --- | --- | --- | --- |
|  | 30 sccm | 90 sccm | 30 sccm | 90 sccm | 30 sccm | 90 sccm |
| Example | 71 | 82 | 8 | 9 | 21 | 9 |
| Comparative Example | 30 | 46 | 16 | 11 | 54 | 43 |

As shown in Table I, the amount of carbon incorporated in the TiN$_x$ thin film prepared in Example using H$_2$ plasma is much less than that prepared in Comparative Example using N$_2$. As the flow rate of hydrogen increases, the amount of the incorporated carbon tends to decrease. For example, Ti/C ratio at 30 sccm was 3.3 while that at 90 sccm was 9.1.

Further, the amount of nitrogen found in the TiN$_x$ film of Example is also less than that of Comparative Example. This result suggests that a Ti-rich thin film can be prepared in accordance with the prevent invention.

Figure 2A:
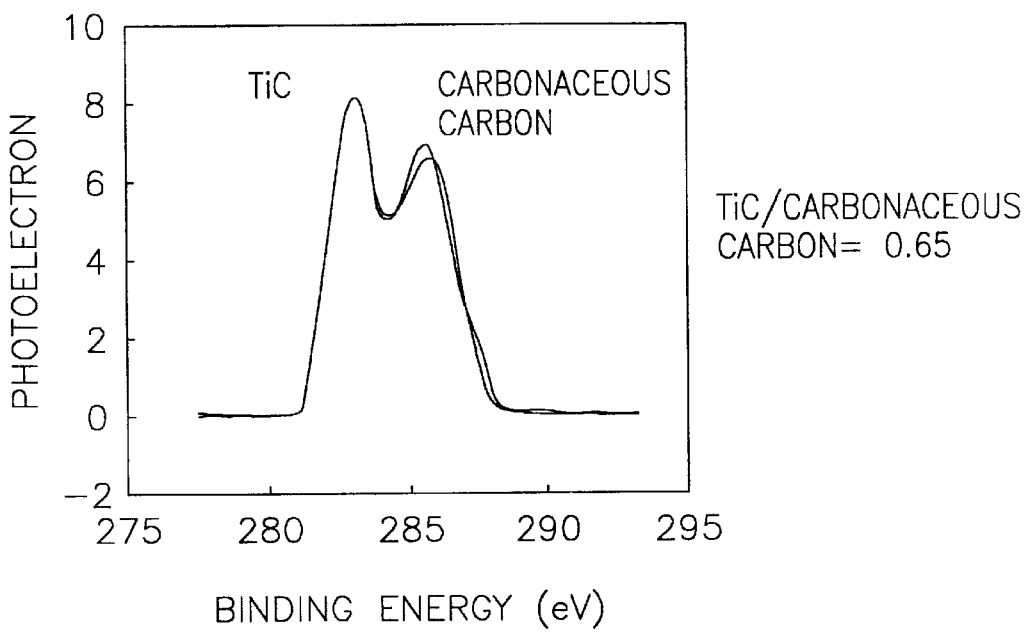
FIGS. 2A and 2B depict X-ray photoelectron spectroscopic scans of $TiN_x$ thin films prepared by the plasma chemical vapor deposition method (2A: $H_2$ plasma, 2B: $N_2$ plasma)
Figure 2B:
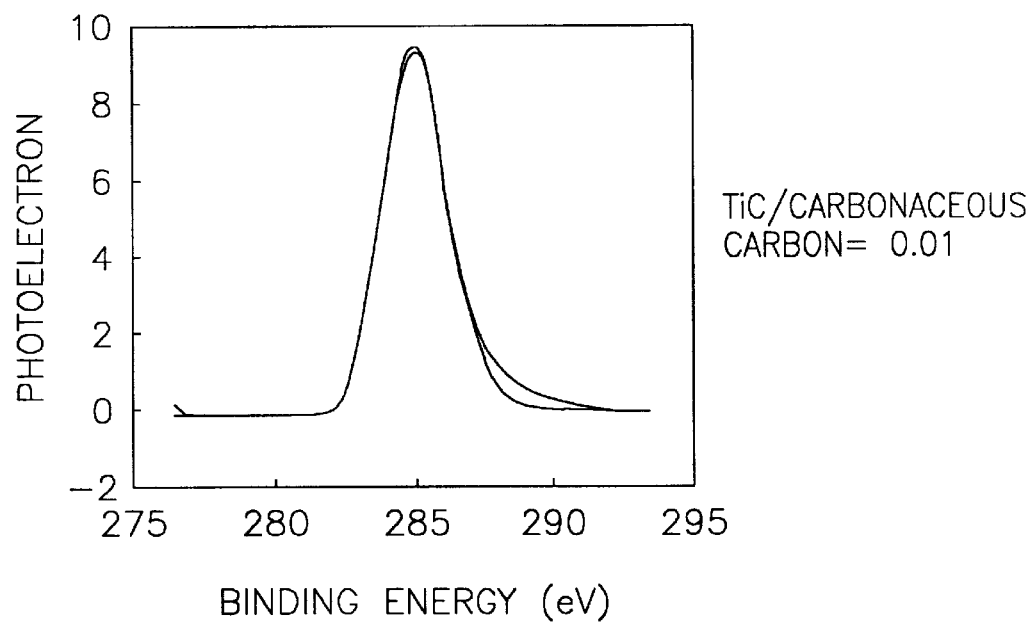

FIGS. 2A and 2B depict X-ray photoelectron spectroscopic scans of TiN$_x$ thin films prepared by the plasma-enhanced chemical vapor deposition method (2A: H$_2$ plasma, 2B: N$_2$ plasma). Carbon is incorporated into the TiN$_x$ film in the form of TiC (282 eV) or carbonaceous carbon (285 eV). It is reported that a film having TiC has a lower specific resistivity than a film having incorporated carbonaceous carbon. As shown in FIG. 2, TiC/carbonaceous carbon ratio observed for the film of Example is much greater than that of Comparative Example.

These results show that the amount of carbon incorporated in the diffusion barrier prepared by employing remote MOCVD with using H$_2$ plasma in accordance with the present invention is much less than that prepared by using N$_2$ plasma and the incorporated carbon exists mostly in the form of TiC.

Figure 3:
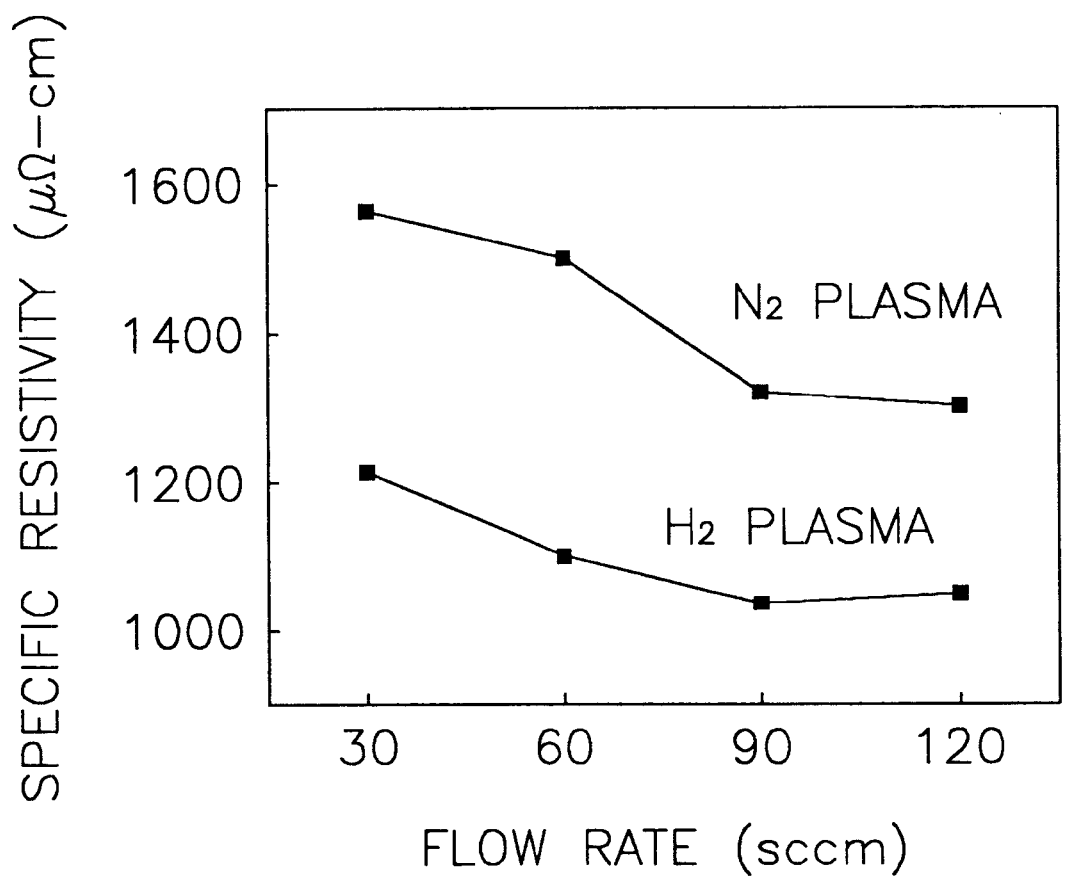
FIG. 3 demonstrates the variation of the specific resistivity of the $TiN_x$ film as a function of the flow rate of the gaseous plasma.

FIG. 3 demonstrates the variation of the specific resistivity of the TiN$_x$ film as function of the flow rate of the plasma reaction gas. The specific resistivity of the TiN$_x$ film prepared by using H$_2$ plasma is lower than that prepared by using N$_2$ plasma.

As shown above, a diffusion barrier for a semiconductor device having a low carbon content and low specific resistivity can be prepared by employing the process of the present invention.

While the invention has been described with respect to the specific embodiments, it should be recognized that various modifications and changes may be made by those skilled in the art to the invention which also fall within the scope of the invention as defined by the appended claims.

What is claimed is:

1. A process for preparing a diffusion barrier on a semiconductor substrate which comprises: conducting remote plasma-enhanced metal organic chemical vapor deposition of a thin film of TiN$_x$ on said substrate using an organotitanium compound under a flow of H$_2$ plasma, wherein x ranges from 0.1 to 1.5.

2. The process of claim 1, wherein the thin film of TiN has a carbon content of less than 30 atom % based on the sum of titanium, nitrogen and carbon constituents of the film.

3. The process of claim 1, wherein the organotitanium compound is tetrakis-dimethylamidotitanium or tetrakis-diethylamidotitanium.

4. The process of claim 1, wherein the semiconductor substrate is a silicone wafer.

* * * * *